United States Patent
Chan et al.

(10) Patent No.: US 11,646,737 B1
(45) Date of Patent: May 9, 2023

(54) ADAPTIVE GATE-BIAS REGULATOR FOR OUTPUT BUFFER WITH POWER-SUPPLY VOLTAGE ABOVE CORE POWER-SUPPLY VOLTAGE

(71) Applicant: Hong Kong Applied Science and Technology Research Institute Company Limited, Hong Kong (HK)

(72) Inventors: Chit Sang Chan, Hong Kong (HK); Chun-Kit Yam, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 17/876,750

(22) Filed: Jul. 29, 2022

(51) Int. Cl.
| | |
|---|---|
| H03K 3/00 | (2006.01) |
| H03K 3/16 | (2006.01) |
| H03K 5/24 | (2006.01) |
| H03K 17/687 | (2006.01) |
| H03K 19/0185 | (2006.01) |
| H03K 17/10 | (2006.01) |
| H03K 19/003 | (2006.01) |

(52) U.S. Cl.
CPC ... *H03K 19/018507* (2013.01); *H03K 17/102* (2013.01); *H03K 19/00315* (2013.01); *H03K 2217/0081* (2013.01)

(58) Field of Classification Search
None
See application file for complete search history.

(56) References Cited

U.S. PATENT DOCUMENTS

| | | | |
|---|---|---|---|
| 5,973,534 A | 10/1999 | Singh | |
| 6,018,257 A * | 1/2000 | Hung | H03K 19/00315 326/86 |
| 7,746,124 B2 * | 6/2010 | Ajit | H03K 19/01818 326/82 |
| 7,839,174 B2 | 11/2010 | Wang et al. | |
| 7,936,209 B2 * | 5/2011 | Bhattacharya | H03K 19/018528 327/108 |

(Continued)

OTHER PUBLICATIONS

ISR and Written Opinion, PCT/CN2022/111857, dated Dec. 16, 2022.

(Continued)

*Primary Examiner* — Kenneth B Wells
(74) *Attorney, Agent, or Firm* — gPatent LLC; Stuart T. Auvinen

(57) ABSTRACT

A level-shifting output buffer has cascode transistors with varying rather than fixed gate bias voltages. An adaptive regulator bypasses the I/O pad voltage to a regulator output when the I/O begins switching, but later clamps the regulator output to a middle bias voltage. The regulator output can be applied to a supply terminal of a buffer that drives the gate of the cascode transistor. Since the adaptive regulator follows the I/O pad voltage as switching begins, a voltage boost is provided to the gates of the cascode transistors, allowing for higher currents or smaller cascode transistors and preventing over-voltage stress. The adaptive regulator has an n-channel bypass transistor between the I/O pad and the regulator output, and an n-channel clamp transistor between the regulator output and the middle bias, with a gate driven from the I/O pad by either a p-channel gate-biasing transistor or an n-channel gate-biasing transistor.

19 Claims, 10 Drawing Sheets

(56) References Cited

U.S. PATENT DOCUMENTS

| | | | |
|---|---|---|---|
| 8,395,433 B2* | 3/2013 | Rien | H03K 19/00315 |
| | | | 326/82 |
| 8,994,412 B2* | 3/2015 | Kim | H03K 3/356165 |
| | | | 327/109 |
| 9,614,529 B1* | 4/2017 | Chen | H03K 19/018514 |
| 10,305,474 B2* | 5/2019 | Lee | H03K 19/00315 |
| 11,296,694 B2* | 4/2022 | Lee | H03K 17/04123 |
| 11,451,197 B2* | 9/2022 | Li | H03F 1/0272 |
| 2002/0186058 A1 | 12/2002 | Prodanov | |
| 2007/0052445 A1 | 3/2007 | Wu et al. | |
| 2007/0279096 A1 | 12/2007 | Chong et al. | |
| 2010/0264974 A1 | 10/2010 | Rien et al. | |
| 2011/0025380 A1 | 2/2011 | Kim et al. | |

OTHER PUBLICATIONS

Ming-Dou Ker & and Yan-Liang Lin, "Design of 2xVDD-tolerant I/O buffer with 1xVDD CMOS devices", IEEE CICC 2009, CICC. 2009.5280763, T-19-1 to T-19-4, 2009.

Gajemdra Singh, "A high speed 3.3V IO buffer with 1.9V tolerant CMOS process", IEEE European Solid-state Circuits Conference, 10.1109/ESSCIR.1998.186225, Aug. 1, 2005.

Ismail Yousr, "High-Voltage Generation and Drive in Low-Voltage CMOS Technology", UCLA Thesis 2015.

* cited by examiner

US 11,646,737 B1

ADAPTIVE GATE-BIAS REGULATOR FOR OUTPUT BUFFER WITH POWER-SUPPLY VOLTAGE ABOVE CORE POWER-SUPPLY VOLTAGE

FIELD OF THE INVENTION

This invention relates to output buffer circuits, and more particularly to level-shifting buffers for multi-supply devices.

BACKGROUND OF THE INVENTION

Semiconductor processing advancements have led to smaller-size transistors and lower power-supply voltages. These smaller transistors have thinner gate oxides and other layers that can be damaged by relatively low voltages. Thus the maximum voltage that can be applied to these smaller transistors is reduced.

The dense logic within the core of a semiconductor Integrated Circuit (IC) or chip can use a lower power-supply voltage to provide the fastest speed. A higher power-supply voltage can be used for the Input/Output (I/O) interface to other chips or components on a Printed-Circuit Board (PCB) or other substrate.

FIG. 1 shows a chip with a higher power-supply voltage for I/O and a lower power-supply voltage for the core. Core 102 has many transistors 10 that can be arranged for logic, memory, or other circuits. Core 102 is powered with a low power-supply voltage, such as 1.8 volts. This low power-supply voltage prevents damage to core transistors 10.

Core 102 connects to external interfaces using I/O 104. I/O 104 has a higher power-supply voltage, such as 3.3 volts. Level shifters in I/O 104 can shift 1.8-volt high level from core 102 to the higher 3.3 volts high levels for the I/O interface.

I/O 104 has many transistors 12 that form the level shifters, input and output buffers, and other components. These I/O transistors 12 might have longer channel lengths for better over-voltage protection, but in a standard semiconductor process their gate oxides are the same thickness as the gate oxides of core transistors 10. Thus transistors 12 in I/O 104 are susceptible to damage from the higher 3.3-volt I/O power supply voltage. Over-voltage of transistors 12 may result in an immediate failure, leakage, or reliability problems over the product lifetime.

FIGS. 2A-2B show a cascoded output buffer for over-voltage protection. In FIG. 2A, cascode transistors 22, 24 are inserted between p-channel driver transistor 20 and n-channel driver transistor 26 between the 3.3-volt power supply and ground. A bias voltage PBIAS is applied to the gate of p-channel cascode transistor 22, while a bias voltage NBIAS is applied to the gate of n-channel cascode transistor 24. PBIAS and NBIAS can be the same fixed voltage in some applications. The gate of n-channel driver transistor 26 receives the input data IN, while the gate of p-channel driver transistor 20 receives a level-shifted input IN_SH, where the high level has been shifted from 1.8 to 3.3 volts.

In FIG. 2B, input IN swings between ground and 1.8 volts, while shifted input IN_SH swings between a low level of 1.8 volts to a high level of 3.3 volts. Bias voltages PBIAS and NBIAS are 1.8 volts. The I/O pad swings from 3.3 volts to 0 volt (ground).

The voltage between the I/O pad and ground is spread out over two transistors 24, 26, reducing the voltage stress on any single transistor. Likewise, the voltage between the 3.3-volt I/O power-supply and the I/O pad is distributed across two transistors 20, 22. Cascode transistor 22 provides an added channel resistance that reduces the voltage applied to p-channel driver transistor 20. Also, cascode transistor 24 provides an added channel resistance that reduces the voltage applied to n-channel driver transistor 26. Node P1 between transistors 20, 22 swings between 3.3 v and 1.8 v, while node N1 between transistors 24, 26 swings between 1.8 v and ground. At steady-state the drain-to-source (VDS) and gate-to-source (VGS) of all transistors is less than 2 volts, preventing over-voltage damage.

However, during voltage transitions a greater voltage stress can be placed on cascode transistors 22, 24, causing potential reliability problems. When the pad is initially at 3.3 volts, and IN switches high, n-channel driver transistor 26 can turn on and rapidly pull node N1 towards ground. N-channel cascode transistor 24 can have more than 2 volts VDS during the switching transition. P-channel cascode transistor 22 can have a similar transient over-voltage stress applied when the pad transitions low-to-high. These transient over-voltage stresses are undesirable.

What is desired is a level-shifting output buffer with reduced over-voltage stresses on its transistors. A level-shifting output buffer is desired that adjusts the bias voltages to the cascode transistors to reduce voltage stresses. An output buffer with adaptive regulators to dynamically adjust cascode gate biases.

DETAILED DESCRIPTION

The present invention relates to an improvement in level-shift output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
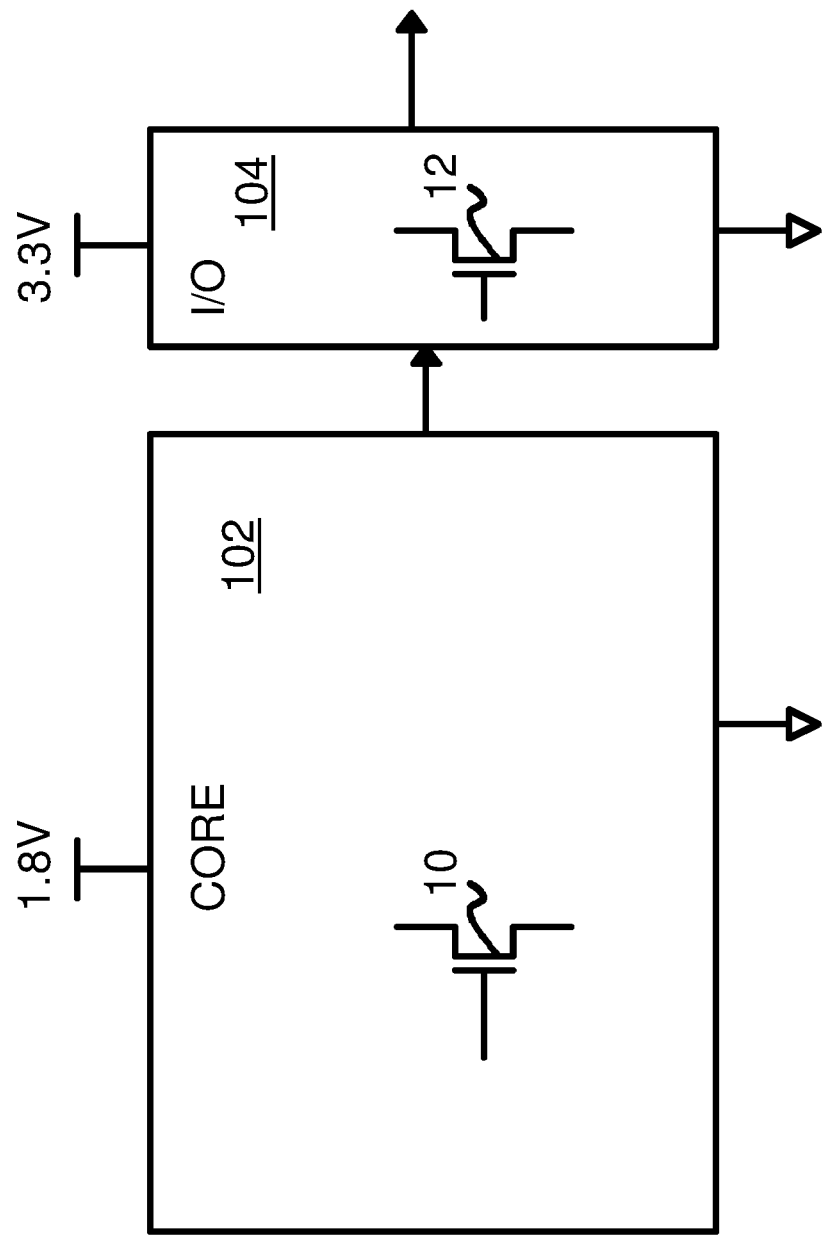
FIG. 1 shows a chip with a higher power-supply voltage for I/O and a lower power-supply voltage for the core.
Figure 2B:
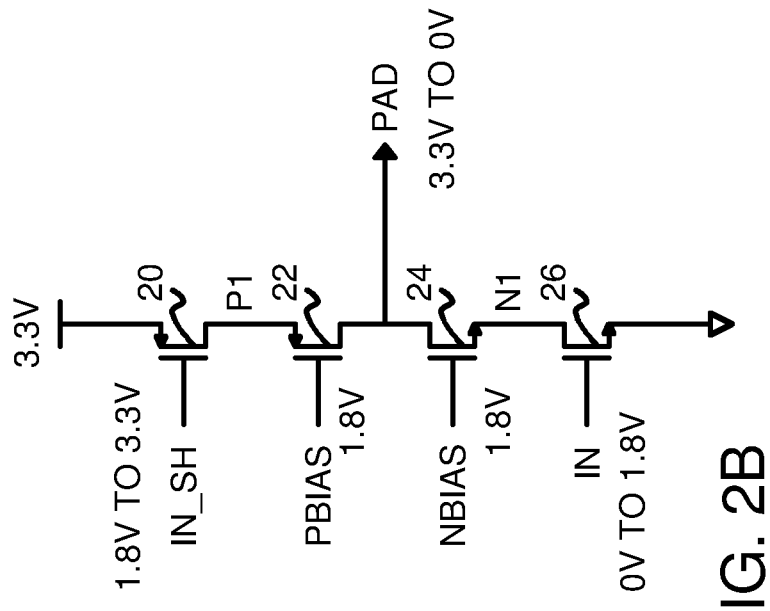
FIGS. 2A-2B show a cascoded output buffer for over-voltage protection.
Figure 2A:
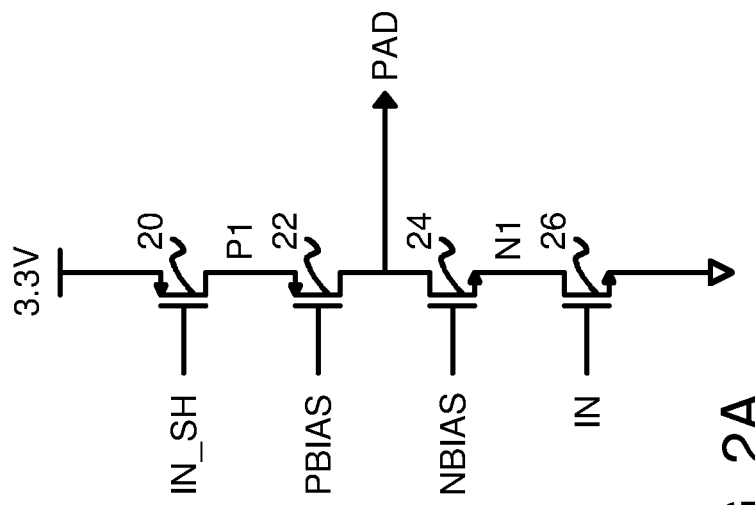
Figure 3:
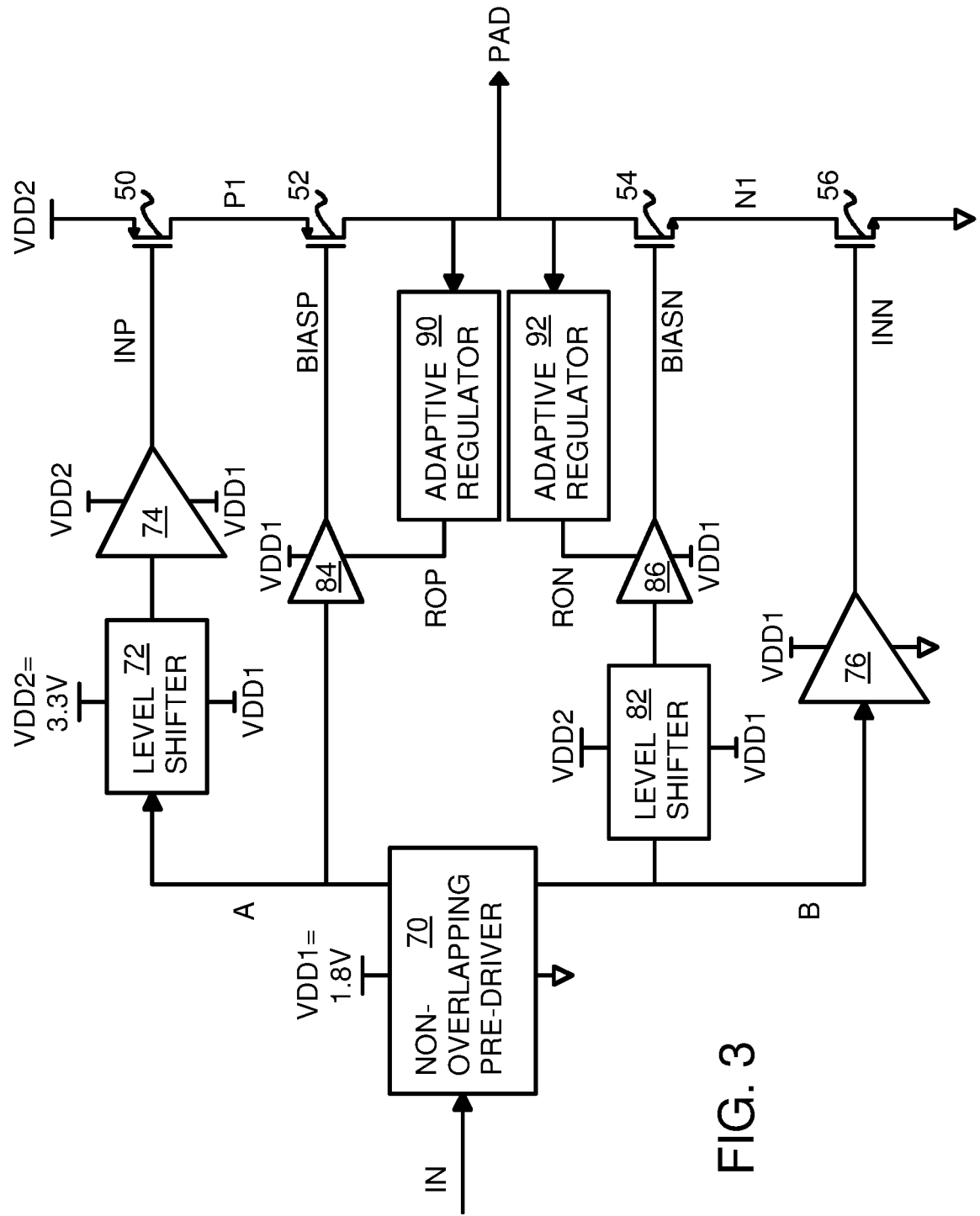
FIG. 3 is a block diagram of a level-shifting output buffer with dynamic cascode gate bias.

FIG. 3 is a block diagram of a level-shifting output buffer with dynamic cascode gate bias. Non-overlapping pre-driver

70 is powered by the core power-supply voltage VDD1, such as 1.8 volts, and drives its outputs A, B between VDD1 and ground, or 1.8 v to 0 v.

Input signal IN is buffered by non-overlapping pre-driver 70 to generate two non-overlapping outputs A, B. The active-high pulse of B is non-overlapping with the active-low pulse of A. For a non-inverting output buffer, when IN is high, A and INN are low to turn off n-channel driver transistor 56, and B and INP are low to turn on p-channel driver transistor 50. Buffer 76 receives the 1.8-volt VDD1 as its power and drives INN high to 1.8 volt and low to ground.

Level shifter 72 has a power input that receives the I/O power-supply voltage VDD2 and has its lower supply terminal connected to VDD1 rather than to the ground supply. Level shifter 72 converts a low on line A from 0 v to 1.8 v, and converts a high on line A from 1.8 v to 3.3 v. Then buffer 74 buffers the shifted output from level shifter 72 to drive INP to the gate of p-channel driver transistor 50. Buffer 74 receives the 3.3-volt VDD2 as its power and the core power VDD1 as its lower supply, and drives INP high to 3.3 volts and low to 1.8 volts.

Figure 4:
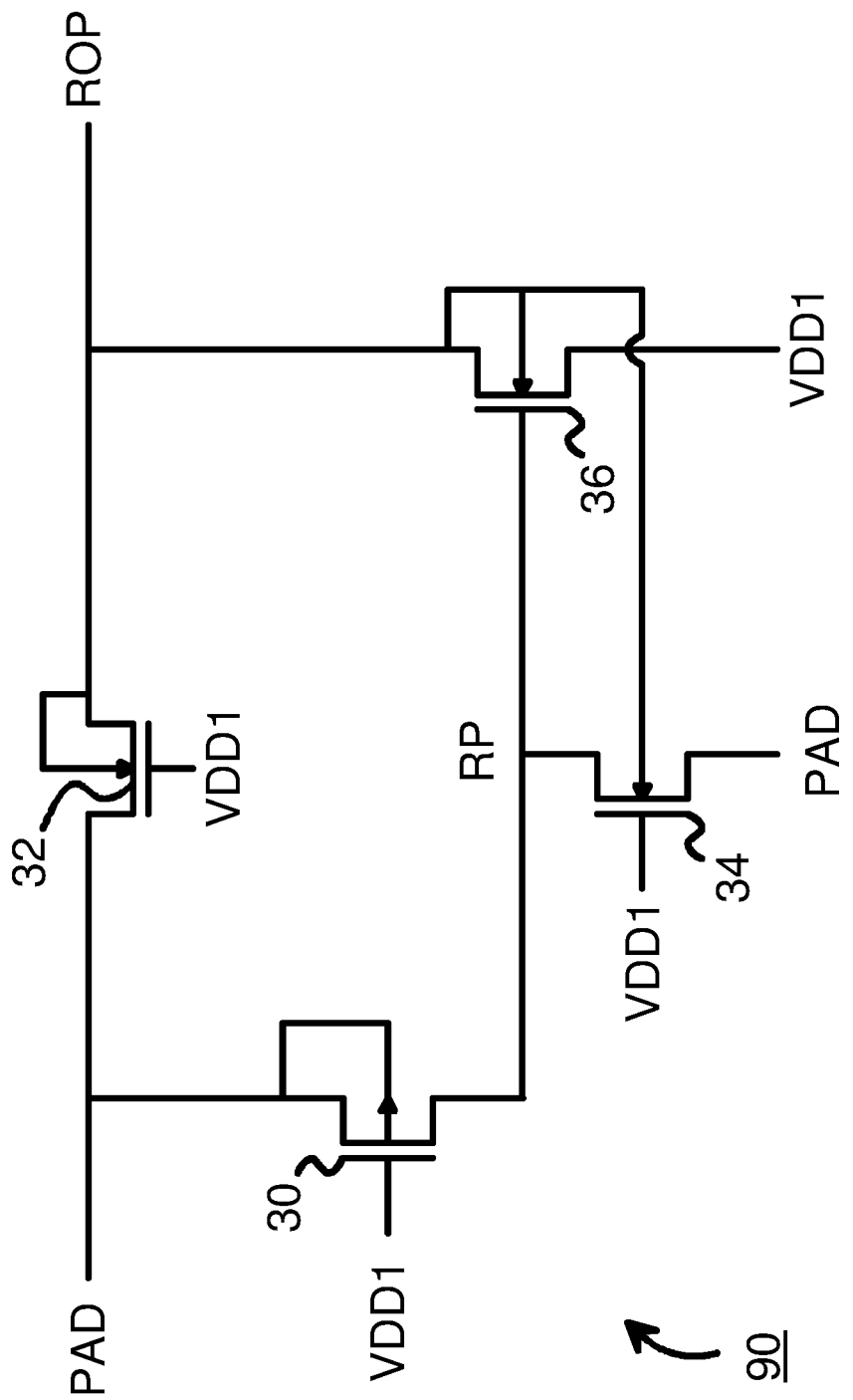
FIG. 4 is a schematic of the adaptive regulator for the p-channel cascode transistor.

Line A is also buffered by buffer 84, which receives the 1.8-volt VDD1 as its power and ROP as its lower supply terminal. ROP is the regulated output from adaptive regulator 90 (FIG. 4). Adaptive regulator 90 has the I/O pad and VDD1 as inputs, and generates ROP to follow the I/O pad voltage from 0 to 1.8 volts. Adaptive regulator 90 clamps its output ROP to VDD1 or 1.8 volts, so when the I/O pad rises above 1.8 v ROP is limited to 1.8 volts.

When A is high (inactive), buffer 84 drives BIASP high to VDD1, turning off p-channel cascode transistor 52. When A is low (active), buffer 84 drives BIASP low to the I/O pad voltage, which is initially 0 volts and begins rising as p-channel driver transistor 50 charges the output load. Once the I/O pad voltage rises to VDD1 (1.8 v), adaptive regulator 90 clamps ROP and the low voltage from buffer 84 to VDD1, so that BIASP, the gate of p-channel cascode transistor 52, is never driven above 1.8 v. BIASP is initially as low as 0 volts as the I/O pad voltage rises during switching. Thus p-channel cascode transistor 52 is driven with a dynamic bias voltage rather than a static bias voltage.

Line B is level-shifted up by level shifter 82, which has a power input that receives the I/O power-supply voltage VDD2 (3.3 v) and has its lower supply terminal connected to VDD1 rather than to the ground supply. Level shifter 82 converts a low on line B from 0 v to 1.8 v, and converts a high on line B from 1.8 v to 3.3 v to drive the input to buffer 86 between 1.8 v and 3.3 v.

Buffer 86 also has VDD1 as its lower supply but has RON applied to its upper power-supply terminal. Adaptive regulator 92 (FIG. 6) receives VDD1 and the I/O pad voltage to generate RON. Adaptive regulator 92 allows RON to follow the I/O pad voltage above VDD1 from 3.3 v to 1.8 v, but clamps RON to 1.8 v when the I/O pad falls below VDD1.

When B is low (inactive), buffer 86 drives BIASN low to VDD1, turning off n-channel cascode transistor 54. When B is high (active), buffer 86 drives BIASN high to the I/O pad voltage, which is initially 3.3 volts (VDD2) and begins falling as n-channel driver transistor 56 discharges the output load. Once the I/O pad voltage falls to VDD1 (1.8 v), adaptive regulator 92 clamps RON and the high voltage from buffer 86 to VDD1, so that BIASN, the gate of n-channel cascode transistor 54, is never driven below 1.8 v. BIASN is initially as high as 3.3 volts as the I/O pad voltage falls during switching.

N-channel cascode transistor 54 is driven with a dynamic bias voltage rather than a static bias voltage. Likewise, p-channel cascode transistor 52 is driven with a dynamic bias voltage rather than a static bias voltage. Adaptive regulators 90, 92 allow the I/O pad voltage to be used at the beginning of switching, but later provides a static bias voltage. A boosted gate-voltage is provided when switching begins, while a constant gate-bias voltage is provided to the cascode transistors after the initial switching drives the I/O pad past VDD1, which is about halfway through switching.

FIG. 4 is a schematic of the adaptive regulator for the p-channel cascode transistor. Adaptive regulator 90 has the core power-supply voltage, VDD1 (1.8 v) and the I/O pad as inputs and generates ROP as the output. ROP defines the lowest voltage of BIASP since ROP is applied to the lower supply terminal of buffer 84 that generates BIASP (FIG. 3).

Adaptive regulator 90 has three n-channel transistors 32, 34, 36 and one p-channel transistor 30. N-channel bypass transistor 32 has its gate connected to VDD1 and its substrate connected to its source and to ROP. The drain of n-channel bypass transistor 32 is connected to the I/O pad.

P-channel gate-biasing transistor 30 has its source and substrate connected to the I/O pad, and its gate driven by VDD1. The drain of p-channel gate-biasing transistor 30 drives gate node RP when the pad is high near VDD2.

N-channel gate-biasing transistor 34 has its drain connected to the I/O pad, its source connected to gate node RP, and its gate driven by VDD1. The drain of n-channel gate-biasing transistor 34 drives gate node RP when the pad is low near ground.

N-channel clamp transistor 36 has its drain connected to VDD1, its source connected to output ROP, and its gate driven by gate node RP that is driven by gate-biasing transistors 30, 34. The substrates of n-channel transistors 32, 34, 36 are all connected to the ROP output.

Figure 5A:
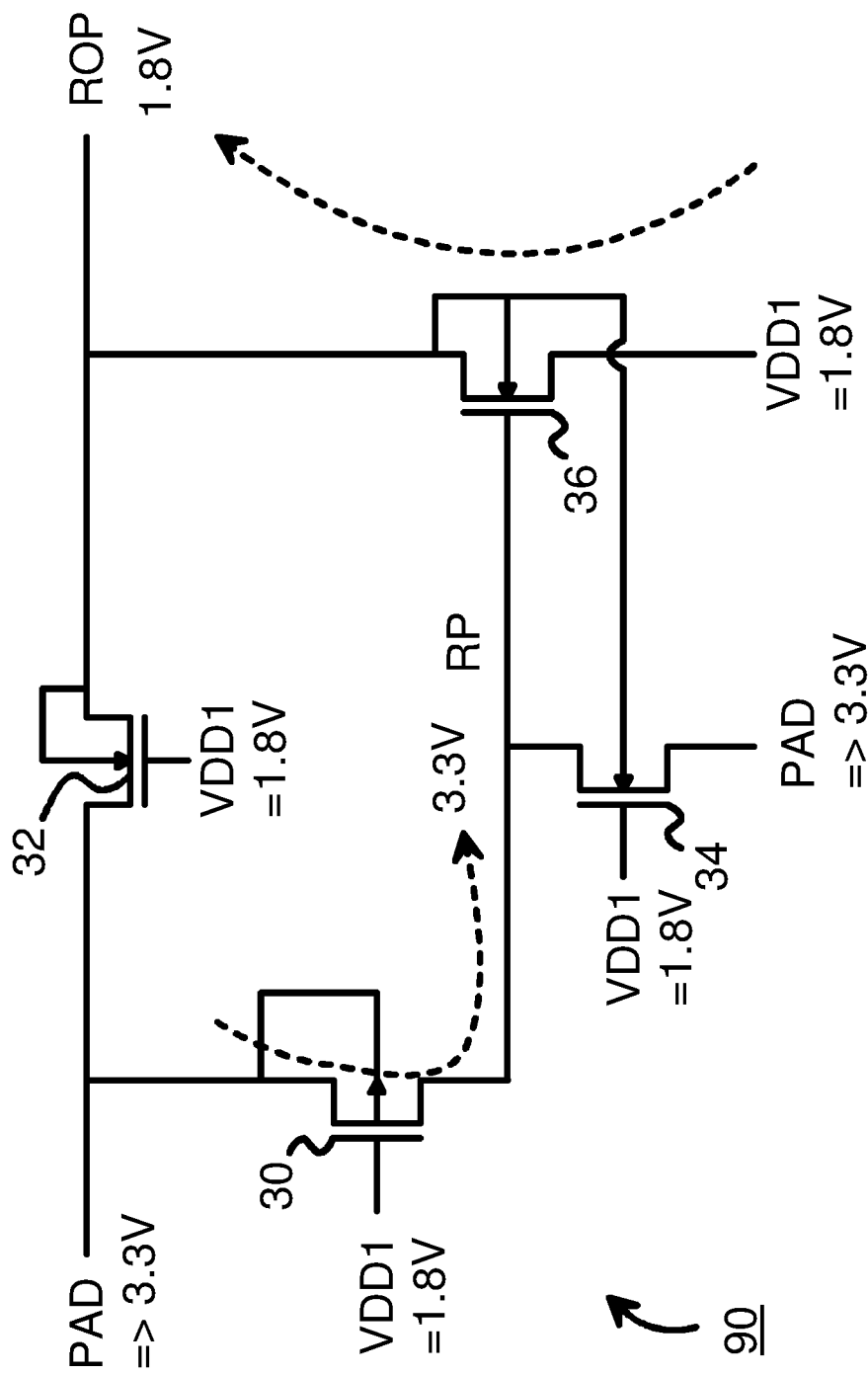
FIG. 5A highlights operation of the P adaptive regulator when the I/O pad switches high.

FIG. 5A highlights operation of the P adaptive regulator when the I/O pad switches high. As the I/O pad voltage nears VDD2 or 3.3 v, n-channel bypass transistor 32 and n-channel gate-biasing transistor 34 turn off since their gates are driven by VDD1. P-channel gate-biasing transistor 30 turns on since its gate, VDD1, is more than a transistor threshold below its source voltage, 3.3 v. P-channel gate-biasing transistor 30 conducts between the I/O pad and gate node RP, charging RP to 3.3 v. The high voltage on gate node RP turns on n-channel clamp transistor 36, connecting VDD1 to output ROP. Output ROP is clamped to VDD1 as the pad voltage rises to VDD2.

Figure 5B:
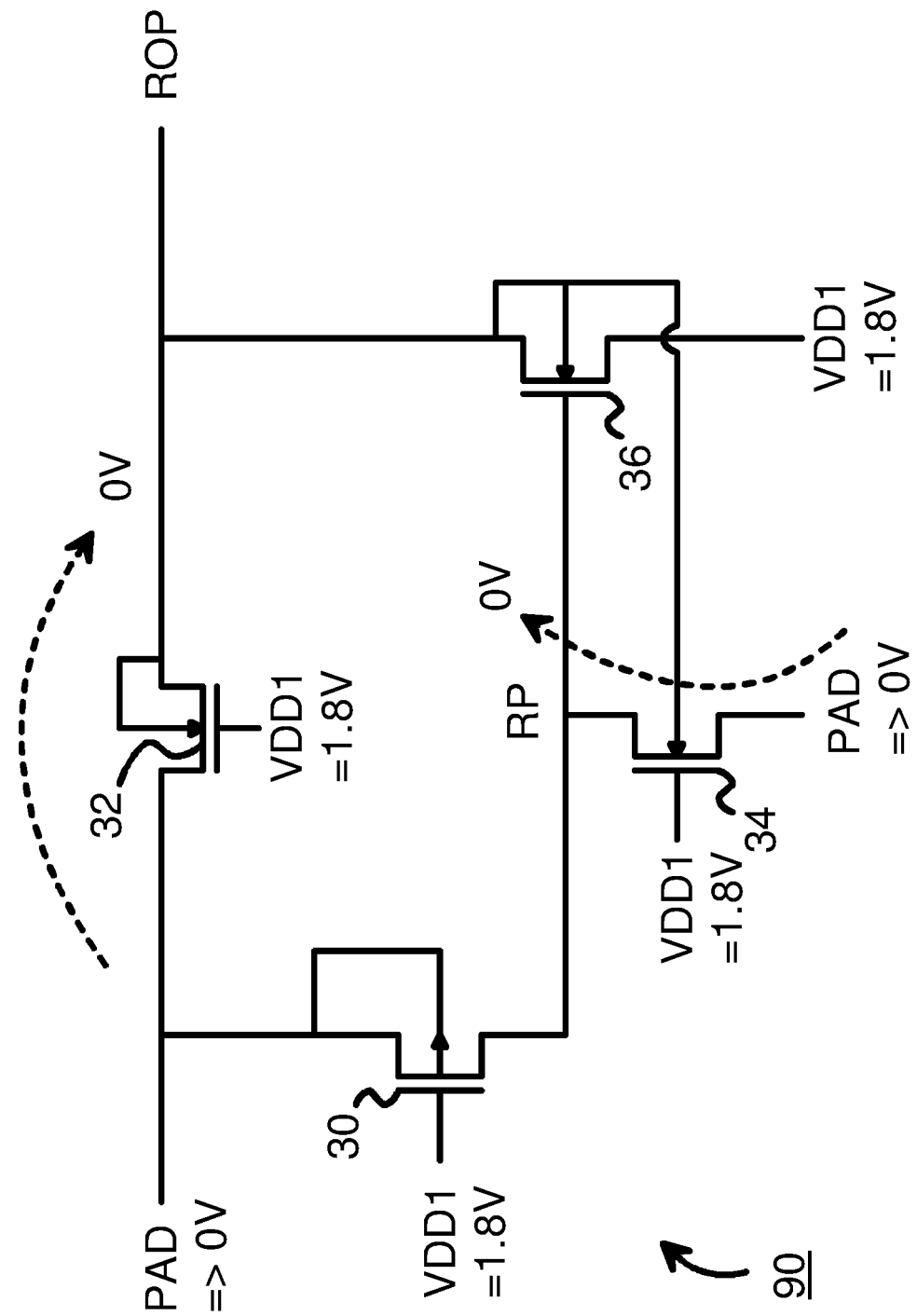
FIG. 5B highlights operation of the P adaptive regulator when the I/O pad switches low.

FIG. 5B highlights operation of the P adaptive regulator when the I/O pad switches low. As the I/O pad voltage nears ground, n-channel bypass transistor 32 turns on since its gate is tied to VDD1. N-channel bypass transistor 32 bypasses the low voltage on the I/O pad to output ROP so that ROP is driven low to 0 v from the I/O pad.

P-channel gate-biasing transistor 30 turns off since its gate, VDD1, is more than a transistor threshold above its source voltage, 0 v. N-channel gate-biasing transistor 34 turns on since its gate, VDD1, is more than a threshold above its drain, the 0 v on the I/O pad. N-channel gate-biasing transistor 34 then discharges gate node RP to ground, turning off n-channel clamp transistor 36. The low I/O pad voltage is bypassed to output ROP by n-channel bypass transistor 32.

Figure 6:
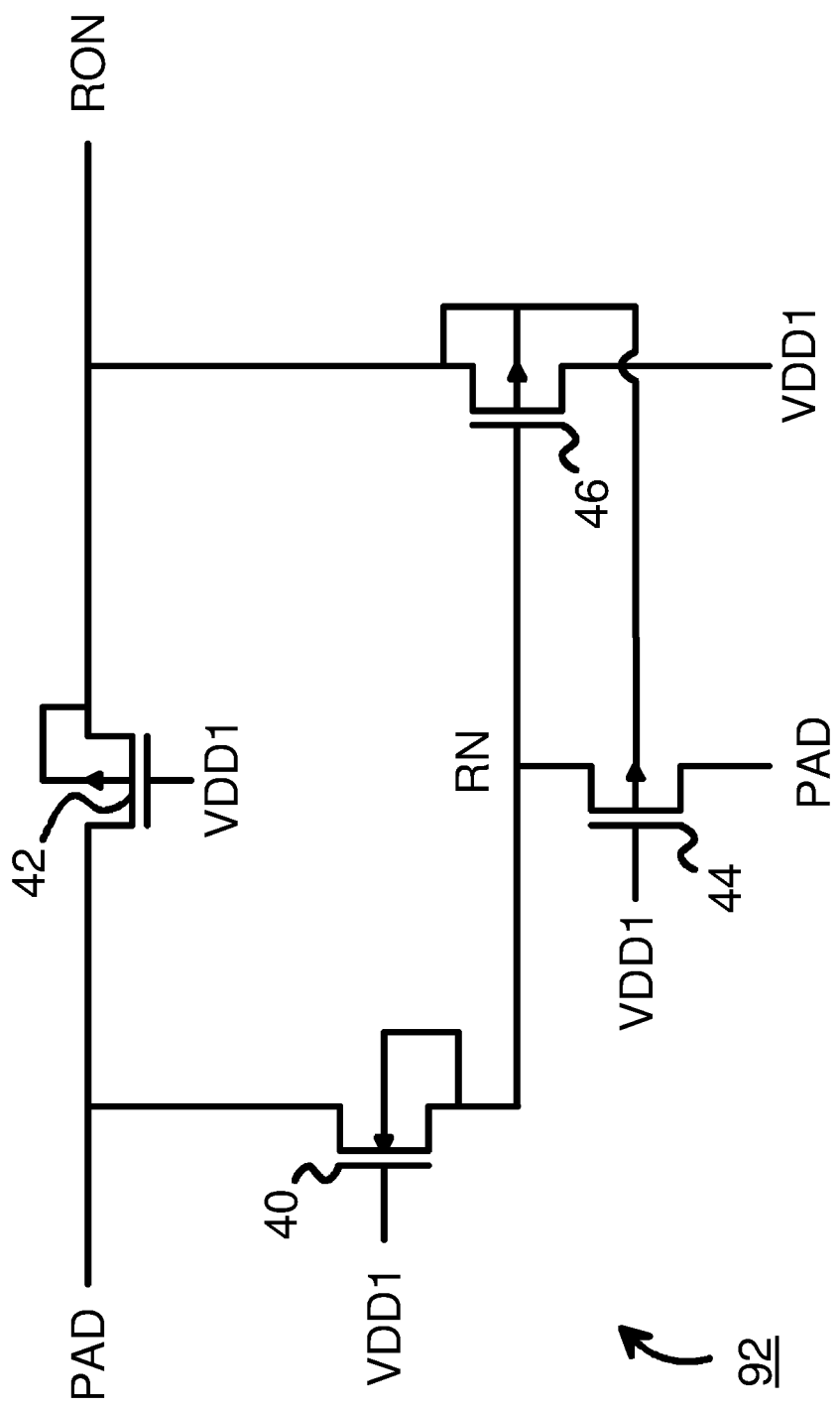
FIG. 6 is a schematic of the adaptive regulator for the n-channel cascode transistor.

FIG. 6 is a schematic of the adaptive regulator for the n-channel cascode transistor. Adaptive regulator 92 has the core power-supply voltage, VDD1 (1.8 v) and the I/O pad as inputs and generates RON as the output. RON defines the highest voltage of BIASN since RON is applied to the upper supply terminal of buffer 86 that generates BIASN (FIG. 3).

Adaptive regulator 92 has three p-channel transistors 42, 44, 46 and one n-channel transistor 40. P-channel bypass transistor 42 has its gate connected to VDD1 and its substrate connected to its source and to RON. The drain of p-channel bypass transistor 42 is connected to the I/O pad.

N-channel gate-biasing transistor 40 has its source and substrate connected to gate node RN, its drain connected to the I/O pad, and its gate driven by VDD1. The drain of n-channel gate-biasing transistor 40 drives gate node RN when the pad is low near ground.

P-channel gate-biasing transistor 44 has its drain connected to the I/O pad, its source connected to gate node RN, and its gate driven by VDD1. The drain of p-channel gate-biasing transistor 44 drives gate node RN when the pad is high near VDD2.

P-channel clamp transistor 46 has its drain connected to VDD1, its source connected to output RON, and its gate driven by gate node RN that is driven by gate-biasing transistors 40, 44. The substrates of p-channel transistors 42, 44, 46 are all connected to the RON output.

Figure 7A:
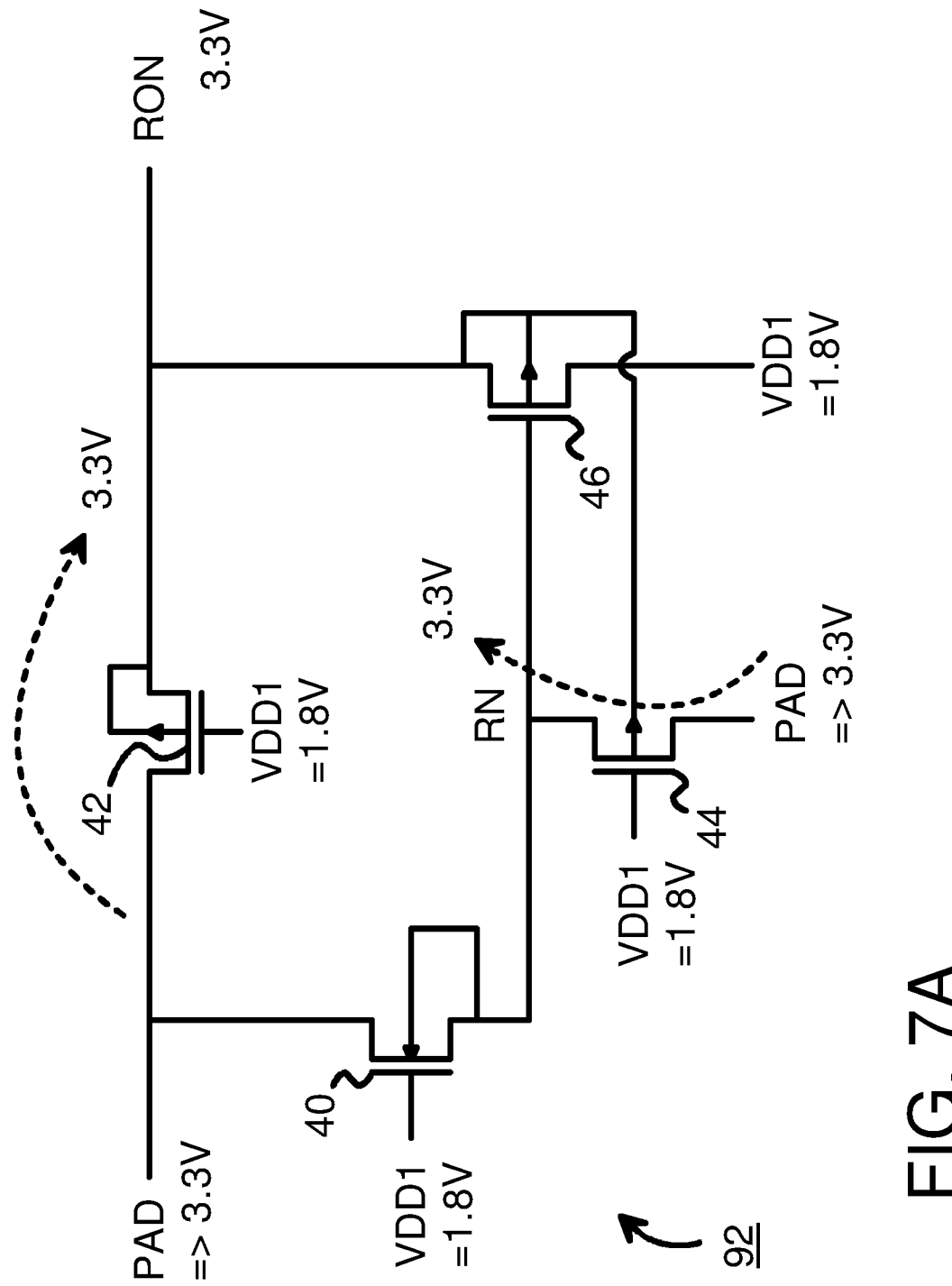
FIG. 7A highlights operation of the N adaptive regulator when the I/O pad switches high.

FIG. 7A highlights operation of the N adaptive regulator when the I/O pad switches high. As the I/O pad voltage nears VDD2 (3.3 v), p-channel bypass transistor 42 and p-channel gate-biasing transistor 44 turn on since their gates are driven by VDD1. N-channel gate-biasing transistor 40 turns off since its gate, VDD1, is not more than a transistor threshold above its source voltage, 3.3 v. P-channel gate-biasing transistor 44 conducts between the I/O pad and gate node RN, charging RN to 3.3 v. The high voltage on gate node RN turns off p-channel clamp transistor 46. The high I/O pad voltage is bypassed to output RON by p-channel bypass transistor 42.

Figure 7B:
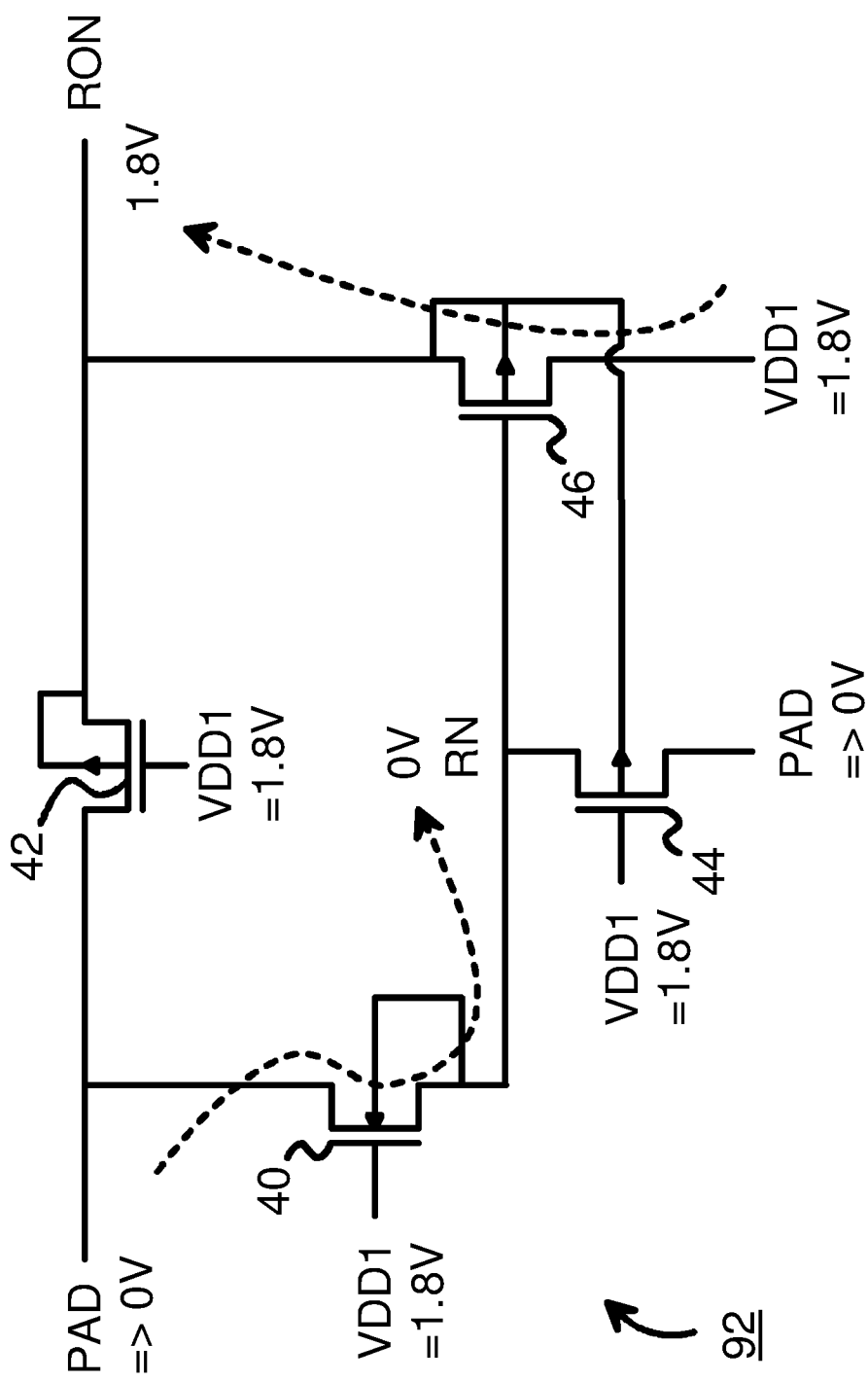
FIG. 7B highlights operation of the N adaptive regulator when the I/O pad switches low.

FIG. 7B highlights operation of the N adaptive regulator when the I/O pad switches low. As the I/O pad voltage nears ground, p-channel bypass transistor 42 and p-channel gate-biasing transistor 44 turn off since their gates are tied to VDD1.

N-channel gate-biasing transistor 40 turns on since its gate, VDD1, is more than a transistor threshold above its source voltage, 0 v. N-channel gate-biasing transistor 40 connects the low voltage on the I/O pad to gate node RN, which falls to 0 v.

The low voltage on gate node RN causes p-channel clamp transistor 46 to turn on, connecting VDD1 to output RON. Output RON is thus clamped to VDD1 as the pad voltage falls to ground.

Figure 8:
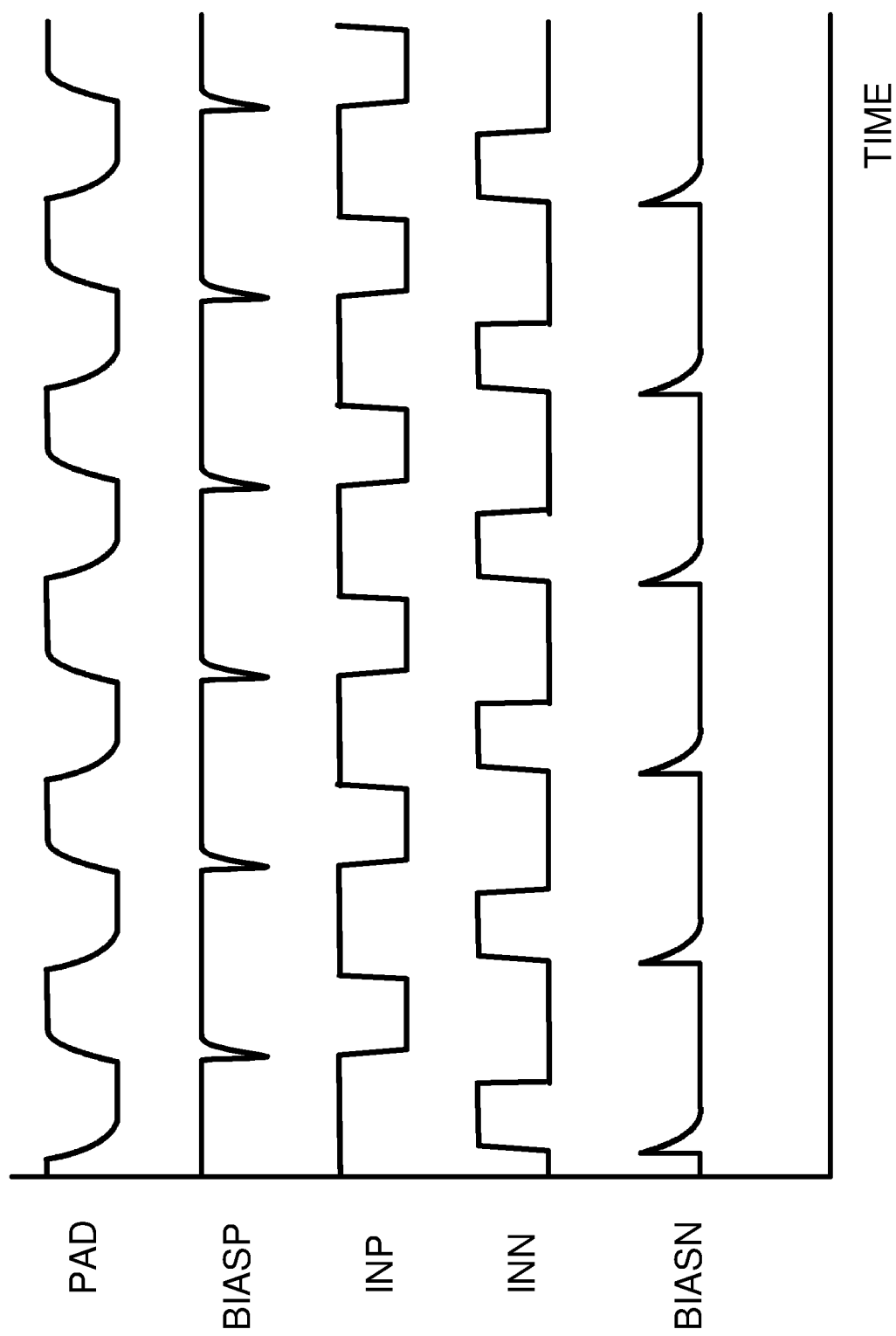
FIG. 8 shows waveforms of operation of the level-shifting output buffer with dynamic cascode gate bias.

FIG. 8 shows waveforms of operation of the level-shifting output buffer with dynamic cascode gate bias. When INN is high, n-channel driver transistor 56 (FIG. 3) turns on, driving the I/O pad high to low. INP is high, turning off p-channel driver transistor 50. When INN goes high, BIASN jumps from 1.8 volts to the initial pad voltage of 3.3 volts as the high input propagates through buffer 86. RON follows the pad voltage, which is initially 3.3 volts, down to 1.8 volt as the pad voltage falls during switching. Since RON is applied to the upper power input of buffer 86, BIASN follows the pad voltage lower after the initial jump to 3.3 volt when INN switches high. Once the pad voltage falls to 1.8 volt, then adaptive regulator 92 clamps RON to 1.8 volts even as the pad voltage falls further to ground. BIASP remains at 1.8 volts during the low-going transition of the I/O pad.

For the high-going output transition, the I/O pad is initially low near ground. When INN goes low, n-channel driver transistor 56 (FIG. 3) turns off. After a delay to ensure that INN and INP are non-overlapping, INP goes low, turning on p-channel driver transistor 50, which drives the I/O pad low to high. BIASN remains at 1.8 volts during the high-going transition of the I/O pad.

When INP goes low, BIASP quickly drops from 1.8 volts to the initial pad voltage of 0 volts as the low input propagates through buffer 84. ROP follows the pad voltage, which is initially near ground, up to 1.8 volts as the pad voltage rises during switching. Since ROP is applied to the lower supply input of buffer 84, BIASP follows the pad voltage higher after the initial dip to ground when INP switches low. Once the pad voltage rises to 1.8 volt, then adaptive regulator 90 clamps ROP to 1.8 volts even as the pad voltage rises further to VDD2.

ALTERNATE EMBODIMENTS

Several other embodiments are contemplated by the inventors. For example while a core VDD1 of 1.8 volts and an I/O VDD2 of 3.3 volts have been described, other values of VDD1 and VDD2 could be substituted, such as 0.8 volt, 1.2 volts, 3.0 volts, 5 volts, etc. Any combination of VDD1 and VDD2 that meets VDD2=2*VDD1 may be substituted. Rather than use VDD1 for the gate biases within adaptive regulator 90, 92, another fixed voltage such as from a voltage divider or other voltage reference generator could be substituted.

The boosted bias voltages allow for the sizes or gate widths of cascode transistors 52, 54 to be reduced when using adaptive regulator 90, 92, compared with the prior art of fixed gate biases. Adaptive regulator 90, 92 track the pad voltage to adjust BIASP and BIASN, so that transistors 50, 52, 54, 56 can operate without voltage over-stress, providing greater reliability. Adaptive regulator 90, 92 can provide this benefit across process variations and output loading, as well as for variations in temperature and supply voltages. VDS and VGS can be less than 2 volts for transistors 50, 52, 54, 56.

Level shifters and buffers can be standard circuits, such as those using inverters. Level shifter 82 can be any type of level shifter, for example, charge-pump type or cross-couple type. Buffer 84 can be a series or chain of inverters. More complex buffers, level shifters, or other components could be substituted or added. Inversions could be added at various locations in the output buffer. If DC current was permitted, A and B lines could avoid delays to ensure non-overlap. Hysteresis of other delays and output wave shaping could be added.

While an output buffer with both P and N adaptive regulators have been shown, to allow for pad-voltage tracking of BIASP and BIASN, it is possible to have BIASP be a fixed voltage and have only BIASN track the pad voltage, using adaptive regulator 92 but omitting adaptive regulator 90.

Buffers 84, 86 have been shown as receiving the regulated outputs from adaptive regulator 90, 92 at supply terminals. Buffers 84, 86 could each be two CMOS inverters in series, with the regulated output applied to the p-channel transistor sources for buffer 86, or applied to the n-channel transistor sources for buffer 84. Rather than use CMOS inverters, other kinds of buffer circuits, selectors, or muxes may be used. For example, buffer 84 could be a mux or selector that applied the regulator output ROP from adaptive regulator 90 to BIASP, the gate of p-channel cascode transistor 52, when INP or an equivalent is low and p-channel driver transistor 50 is turned on, or that connects VDD1 to BIASP when INP is high.

Different transistor, capacitor, resistor, and other device sizes can be used, and various layout arrangements can be used, such as multi-leg, ring, doughnut or irregular-shape transistors. Currents can be positive or negative currents and flow in either direction. Many second and third order circuit effects may be present and may be significant, especially for smaller device sizes. A circuit simulation may be used to account for these secondary factors during design.

Devices may be implemented using n-channel, p-channel, or bipolar transistors, or junctions within these transistors. The gate lengths can be increased to provide better protection from damage.

Many variations of IC semiconductor manufacturing processes are possible. Various materials may be used. Additional process steps may be added, such as for additional metal layers or for other transistor types or modification of standard complementary metal-oxide-semiconductor (CMOS) transistors when the transistors are integrated onto a larger device. While complementary metal-oxide-semiconductor (CMOS) transistors have been described, other kinds of transistors could be substituted for some embodiments, such as n-channel only, p-channel only when the output swing can be limited, or various alternate transistor technologies such as Bipolar or BiCMOS. The CMOS process may be a Fin Field-Effect Transistor (FinFET) process.

Terms such as up, down, above, under, horizontal, vertical, inside, outside, are relative and depend on the viewpoint and are not meant to limit the invention to a particular perspective. Devices may be rotated so that vertical is horizontal and horizontal is vertical, so these terms are viewer dependent.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A cascode-bias-boosting output buffer comprising:
an n-channel driver transistor having a source connected to a ground, a gate driven by a first data signal, and a drain connected to a first node;
an n-channel cascode transistor having a source connected to the first node, a drain connected to an output node having an output voltage, and a gate connected to a lower cascode gate node;
a p-channel cascode transistor having a source connected to a second node, a drain connected to the output node, and a gate connected to a lower cascode gate node;
a p-channel driver transistor having a source connected to an upper power supply, a gate driven by a second data signal, and a drain connected to the second node;
an upper adaptive regulator receiving the output node as an input, and receiving a middle bias having a middle bias voltage, the upper adaptive regulator generating an upper regulator output by bypassing the output node to the upper regulator output when the output node is below the middle bias voltage at a beginning of a rising-edge transition of the output node, and by clamping the upper regulator output to the middle bias voltage when the output voltage is above the middle bias voltage;
wherein the upper regulator output is applied to the upper cascode gate node to provide a varying gate bias to the p-channel cascode transistor; and
a lower adaptive regulator receiving the output node as an input, and receiving the middle bias, the lower adaptive regulator generating a lower regulator output by bypassing the output node to the lower regulator output when the output node is above the middle bias voltage at a beginning of a falling-edge transition of the output node, and by clamping the lower regulator output to the middle bias voltage when the output voltage is below the middle bias voltage;
wherein the lower regulator output is applied to the lower cascode gate node to provide a varying gate bias to the n-channel cascode transistor.

2. The cascode-bias-boosting output buffer of claim 1 wherein the upper adaptive regulator comprises:
an upper n-channel bypass transistor connected between the output node and the upper regulator output, and having a gate receiving the middle bias;
an upper n-channel clamp transistor connected between the upper regulator output and the middle bias, and having a gate connected to an upper gate clamp node;
an upper p-channel gate-biasing transistor connected between the output node and the upper gate clamp node, and having a gate receiving the middle bias;
an upper n-channel gate-biasing transistor connected between the output node and the upper gate clamp node, and having a gate receiving the middle bias.

3. The cascode-bias-boosting output buffer of claim 2 wherein the lower adaptive regulator comprises:
a lower p-channel bypass transistor connected between the output node and the lower regulator output, and having a gate receiving the middle bias;
a lower p-channel clamp transistor connected between the lower regulator output and the middle bias, and having a gate connected to a lower gate clamp node;

a lower n-channel gate-biasing transistor connected between the output node and the lower gate clamp node, and having a gate receiving the middle bias;

a lower p-channel gate-biasing transistor connected between the output node and the lower gate clamp node, and having a gate receiving the middle bias.

4. The cascode-bias-boosting output buffer of claim 3 wherein substrates of the upper n-channel bypass transistor, the upper n-channel clamp transistor, and the upper n-channel gate-biasing transistor are connected to the upper regulator output;

wherein a substrate of the upper p-channel gate-biasing transistor is connected to the output node;

wherein substrates of the lower p-channel bypass transistor, the lower p-channel clamp transistor, and the lower p-channel gate-biasing transistor are connected to the lower regulator output;

wherein a substrate of the lower n-channel gate-biasing transistor is connected to the lower gate clamp node.

5. The cascode-bias-boosting output buffer of claim 3 further comprising:

an upper cascode-biasing buffer having an input receiving a third data signal, and receiving the middle bias at an upper supply terminal, and receiving the upper regulator output at a lower supply terminal, the upper cascode-biasing buffer using the upper regulator output to drive the upper cascode gate node to provide a varying gate bias to the p-channel cascode transistor in response to the third data signal;

a lower cascode-biasing buffer having an input receiving a fourth data signal, and receiving the middle bias at a lower supply terminal, and receiving the lower regulator output at an upper supply terminal, the lower cascode-biasing buffer using the lower regulator output to drive the lower cascode gate node to provide a varying gate bias to the n-channel cascode transistor in response to the fourth data signal.

6. The cascode-bias-boosting output buffer of claim 5 wherein the upper cascode-biasing buffer driving the middle bias to the upper cascode gate node when the third data signal indicates that the p-channel driver transistor is turned off, and using the upper regulator output to drive the upper cascode gate node when the third data signal indicates that the p-channel driver transistor is turned on;

wherein the lower cascode-biasing buffer driving the middle bias to the lower cascode gate node when the fourth data signal indicates that the n-channel driver transistor is turned off, and using the lower regulator output to drive the lower cascode gate node when the fourth data signal indicates that the n-channel driver transistor is turned on.

7. The cascode-bias-boosting output buffer of claim 6 wherein the middle bias voltage is at least 30% less than an upper power supply voltage of the upper power supply.

8. The cascode-bias-boosting output buffer of claim 7 further comprising:

a pre-driver receiving a data signal and generating the third data signal and a fifth data signal that are non-overlapping;

a lower buffer that receives the fifth data signal and generates the first data signal to the gate of the n-channel driver transistor.

9. The cascode-bias-boosting output buffer of claim 8 wherein the pre-driver and the lower buffer are powered by the middle bias.

10. The cascode-bias-boosting output buffer of claim 9 further comprising:

an upper level shifter buffer that receives the third data signal and shifts the third data signal upward to generate the second data signal to the gate of the p-channel driver transistor, wherein the upper level shifter buffer receives the upper power supply.

11. The cascode-bias-boosting output buffer of claim 10 further comprising:

a lower level shifter that receives the fifth data signal and shifts the fifth data signal upward to generate the fourth data signal that is input to the lower cascode-biasing buffer;

wherein the lower level shifter receives the upper power supply.

12. A bias-boosted output buffer comprising:

an I/O power supply having an I/O power supply voltage;

a ground supply having a ground voltage;

a middle bias having a middle bias voltage that is between the I/O power supply voltage and the ground voltage;

an output node;

a data input having a pull-up state that is active when the bias-boosted output buffer drives the output node to a high voltage, and a pull-down state that is active when the bias-boosted output buffer drives the output node to a low voltage, wherein the high voltage is higher than the low voltage;

a pull-up driver transistor having a gate driven by a first node that turns on the pull-up driver transistor to conduct current between the I/O power supply and a first pull-up node when the data input is in the pull-up state;

a pull-up cascode transistor having a gate driven by a pull-up variable bias for controlling current between the first pull-up node and the output node;

a first adaptive regulator that receives the output node and the middle bias as inputs, for generating a first variable bias;

a first bias buffer for driving the pull-up variable bias with the first variable bias when the data input is the pull-up state, and for driving the pull-up variable bias with the middle bias when the pull-up state is not active;

a pull-down driver transistor having a gate driven by a second node that turns on the pull-down driver transistor to conduct current between the ground supply and a second pull-down node when the data input is in the pull-down state;

a pull-down cascode transistor having a gate driven by a pull-down variable bias for controlling current between the second pull-down node and the output node;

a second adaptive regulator that receives the output node and the middle bias as inputs, for generating a second variable bias; and a second bias buffer for driving the pull-down variable bias with the second variable bias when the data input is in the pull-down state, and for driving the pull-down variable bias with the middle bias when the pull-down state is not active;

wherein the second adaptive regulator comprises:

a second bypass transistor receiving the middle bias on a gate for controlling current between the output node and the second variable bias;

a second clamp transistor having a gate connected to a second gate node for controlling current between the middle bias and the second variable bias;

a second complementary gate-biasing transistor receiving the middle bias on a gate for controlling current between the output node and the second gate node;

a second gate-biasing transistor receiving the middle bias on a gate for controlling current between the output node and the second gate node;

wherein the second complementary gate-biasing transistor is complementary transistor type to the second gate-biasing transistor.

13. The bias-boosted output buffer of claim 12 wherein the first adaptive regulator comprises:

a first bypass transistor receiving the middle bias on a gate for controlling current between the output node and the first variable bias;

a first clamp transistor having a gate connected to a first gate node for controlling current between the middle bias and the first variable bias;

a first gate-biasing transistor receiving the middle bias on a gate for controlling current between the output node and the first gate node;

a first complementary gate-biasing transistor receiving the middle bias on a gate for controlling current between the output node and the first gate node;

wherein the first complementary gate-biasing transistor is a complementary transistor type to the first gate-biasing transistor.

14. The bias-boosted output buffer of claim 13 further comprising:

a first level shifter for increasing voltage levels of the data input to generate a shifted data signal on the first node, the first level shifter receiving the I/O power supply;

a second level shifter for increasing voltage levels of the data input to generate a shifted data signal to the second bias buffer, the second level shifter receiving the I/O power supply.

15. The bias-boosted output buffer of claim 14 further comprising:

a third buffer for driving the second node to the gate of the pull-down driver transistor, the third buffer powered by the middle bias;

a non-overlapping pre-driver that receives the data input and uses the middle bias as a power supply voltage, for generating a first data signal to the first level shifter and to the first bias buffer, and for generating a second data signal to the second level shifter and to the third buffer.

16. An output buffer comprising:

n-channel driver transistor means for conducting between a first node and a ground in response to a gate driven by a first data signal;

n-channel cascode transistor means for conducting between the first node and an output node having an output voltage, in response to a gate connected to a lower cascode gate node;

p-channel cascode transistor means for conducting between a second node and the output node, in response to a gate connected to an upper cascode gate node;

p-channel driver transistor means for conducting between an upper power supply and the second node, in response to a gate driven by a second data signal;

upper adaptive regulator means, receiving the output node as an input, and receiving a middle bias having a middle bias voltage, for generating an upper regulated output by bypassing the output node to the upper regulated output when the output node is below the middle bias voltage at a beginning of a rising-edge transition of the output node, and by clamping the upper regulated output to the middle bias voltage when the output voltage is above the middle bias voltage;

wherein the upper regulated output is applied to the upper cascode gate node to provide a varying gate bias to the p-channel cascode transistor means; and lower adaptive regulator means, receiving the output node as an input, and receiving the middle bias, for generating a lower regulated output by bypassing the output node to the lower regulated output when the output node is above the middle bias voltage at a beginning of a falling-edge transition of the output node, and by clamping the lower regulated output to the middle bias voltage when the output voltage is below the middle bias voltage;

wherein the lower regulated output is applied to the lower cascode gate node to provide a varying gate bias to the n-channel cascode transistor means.

17. The output buffer of claim 16 wherein the upper adaptive regulator means further comprises:

upper n-channel bypass transistor means for conducting between the output node and the upper regulated output, in response to a gate receiving the middle bias;

upper n-channel clamp transistor means for conducting between the upper regulated output and the middle bias, in response to a gate connected to an upper gate clamp node;

upper p-channel gate-biasing transistor means for conducting between the output node and the upper gate clamp node, in response to a gate receiving the middle bias;

upper n-channel gate-biasing transistor means for conducting between the output node and the upper gate clamp node, in response to a gate receiving the middle bias.

18. The output buffer of claim 17 wherein the lower adaptive regulator means further comprises:

lower p-channel bypass transistor means for conducting between the output node and the lower regulated output, in response to a gate receiving the middle bias;

lower p-channel clamp transistor means for conducting between the lower regulated output and the middle bias, in response to a gate connected to a lower gate clamp node;

lower n-channel gate-biasing transistor means for conducting between the output node and the lower gate clamp node, in response to a gate receiving the middle bias;

lower p-channel gate-biasing transistor means for conducting between the output node and the lower gate clamp node, in response to a gate receiving the middle bias.

19. The output buffer of claim 18 wherein substrates of the upper n-channel bypass transistor means, the upper n-channel clamp transistor means, and the upper n-channel gate-biasing transistor means are connected to the upper regulated output;

wherein a substrate of the upper p-channel gate-biasing transistor means is connected to the output node;

wherein substrates of the lower p-channel bypass transistor means, the lower p-channel clamp transistor means, and the lower p-channel gate-biasing transistor means are connected to the lower regulated output;

wherein a substrate of the lower n-channel gate-biasing transistor means is connected to the lower gate clamp node.

* * * * *